(12) United States Patent
Cui et al.

(10) Patent No.: US 7,090,783 B1
(45) Date of Patent: Aug. 15, 2006

(54) LITHOGRAPHY-BASED PATTERNING OF LAYER-BY-LAYER NANO-ASSEMBLED THIN FILMS

(75) Inventors: Tianhong Cui, Ruston, LA (US); Yuri Lvov, Ruston, LA (US); Feng Hua, Ruston, LA (US)

(73) Assignee: Louisiana Tech University Research Foundation as a Division of the Louisiana Tech University Foundation, Ruston, LA (US)

( * ) Notice: Subject to any disclaimer, the term of this patent is extended or adjusted under 35 U.S.C. 154(b) by 232 days.

(21) Appl. No.: 10/387,769

(22) Filed: Mar. 13, 2003

(51) Int. Cl.
*B44C 1/22* (2006.01)

(52) U.S. Cl. .......................... 216/40; 216/41; 216/47; 216/49; 427/256; 427/259; 427/404; 428/195; 428/209; 430/311; 430/312; 430/313

(58) Field of Classification Search ................ 216/12, 216/40, 41, 47, 49; 427/256, 259, 286; 428/195, 428/199; 430/311, 312
See application file for complete search history.

(56) References Cited

U.S. PATENT DOCUMENTS

| | | | | |
|---|---|---|---|---|
| 5,208,111 A * | 5/1993 | Decher et al. | ............... | 428/420 |
| 5,539,573 A * | 7/1996 | Schalz et al. | ............... | 359/381 |
| 5,686,549 A * | 11/1997 | Grainger et al. | ............... | 528/25 |
| 5,688,642 A * | 11/1997 | Chrisey et al. | ................ | 435/6 |
| 5,727,977 A * | 3/1998 | Maracas et al. | ............... | 445/24 |
| 5,885,753 A * | 3/1999 | Crooks et al. | ............... | 430/325 |
| 6,020,175 A | 2/2000 | Onda et al. | .................. | 435/180 |
| 6,022,590 A * | 2/2000 | Ferguson et al. | ............. | 427/354 |
| 6,114,099 A * | 9/2000 | Liu et al. | ..................... | 430/324 |
| 6,479,146 B1 | 11/2002 | Caruso et al. | .............. | 428/403 |
| 6,586,158 B1 * | 7/2003 | Dobisz et al. | .............. | 430/296 |
| 2003/0152703 A1 * | 8/2003 | Hammond et al. | ......... | 427/256 |
| 2005/0001317 A1 * | 1/2005 | Ganapathiraman et al. | . | 257/751 |

OTHER PUBLICATIONS

G. Decher; *Fuzzy Nanoassemblies: Toward Layered Polymeric Multicomposites*; Aug. 29, 1997; pp. 1230-1236; Science Magazine, vol. 277.

H. Zheng, I. Lee, M. Rubner & P. Hammond; *Two Component Particle Arrays on Patterned Polyelectrolyte Multilayer Templates*; Jan. 25, 2002; Advanced Materials HEFT 8.

X. Juang, H. Zheng, S. Gourdin & P. Hammond; *Polymer-on-Polymer Stamping: Universal Approaches to Chemically Patterned Surfaces*; Jan. 10, 2002; pp. 2607-2615; Langmuir, vol. 18, No. 7.

K. Chen, X. Jiang, L. Kimerling & P. Hammond; *Selective Self-Organization of Colloids on Patterned Polyelectrolyte Templates*; Jun. 9, 2000; pp. 7825-7834; Langmuir, vol. 16, No. 20.

(Continued)

*Primary Examiner*—Anita Alanko
(74) *Attorney, Agent, or Firm*—Jones, Walker, Waechter, Poitevent, Carrere & Denegre, L.L.P.

(57) ABSTRACT

A method of patterning self-assembled thin films, including forming a photoresist layer on a substrate and then patterning and etching the photoresist layer. In combination with the etched photoresist layer, a self-assembled layer is formed on the substrate using LbL self-assembly.

15 Claims, 3 Drawing Sheets

OTHER PUBLICATIONS

Y. Lvov, K. Ariga, M. Onda, I. Ichinose & T. Kunitake; *Alternate Assembly of Ordered Multilayers of $SiO_2$ and Other Nanoparticles and Polyions*; May 19, 1997; pp. 6195-6203; *Langmuir*, vol. 13, No. 23.

Y. Lvov, G. Decher & H. Mohwald; *Assembly, Structural Characterization, and Thermal Behavior of Layer-by-Layer Deposited Ultrathin Films of Poly (vinyl sulfate) and Poly (allylamine)*; Jul. 27, 1992; pp. 481-486; *Langmuir*, vol. 9, No. 2.

T. Serizawa, S. Kamimura & M. Akashi; *Electrostatic Adsorption of Polystyrene Particles with Difference Surface Charges onto the Surface of an Ultrathin Polymer Film*; Aug. 10, 1999; pp. 237-245; *Colloids and Surfaces A: Physicochemical & Engineering Aspects*164.

X. Jiang & P. Hammond; *Selective Deposition in Layer-by-Layer Assembly: Functional Graft Copolymers as Molecular Templates*; Jul. 18, 2000; pp. 8501-8509; *Langmuir*, vol. 16, No. 22.

* cited by examiner

LITHOGRAPHY-BASED PATTERNING OF LAYER-BY-LAYER NANO-ASSEMBLED THIN FILMS

BACKGROUND OF INVENTION

The present invention relates to the production of micro-patterns using layer-by-layer ("LbL") self-assembly techniques. More specifically, the present invention relates to the combination of LbL self-assembly techniques with lithographic techniques to produce micro-patterns.

It is well known to use lithography techniques to form micro-patterns on silicon substrates during the production of integrated circuits, micro-electrical-mechanical systems (MEMS), and other micro-devices. A more recent, but rapidly growing technology area is LbL self-assembly techniques. LbL self-assembly generally consists of providing a charged substrate and placing the substrate in a first polyion solution having a charge opposite the substrate, thereby forming a thin film of the first polyion on the substrate. The substrate may then be placed in a second polyion solution (having a charge opposite the first polyion), thereby forming a second thin film of the second polyion. This basic process can be greatly varied to create films of different thicknesses and formed of many different polyions. Examples of the LbL self-assembly process may be seen in references such as U.S. Pat. No. 6,479,146, which is incorporated by reference herein in its entirety.

Research has been directed toward forming micro-patterns using LbL self-assembly. This research has mostly been based on the microprinting technique in which a template is first fabricated by stamping two functional chemical groups on a flat substrate, wherein one of these functional groups is adhesion resisting and the other adhesion promoting toward the particles which will later be used to form the micro-pattern. Typically the desired micro-pattern is created on the stamp by lithographic or other means. The functional chemicals are stamped onto the flat substrate in shape of the micro-pattern formed on the stamp and nanoparticles are directed onto adhesion-promoting regions while they are repelled by adhesion-resisting regions. This method has been successful, but requires careful and sometimes restrictive selection of chemicals and strict control during the adhesion or absorption process. Moreover, this process tends to limit the number of different chemicals which can be used to structure the micro-pattern and due to the flexible nature of the stamp material, tends to limit the resolution consistently achievable. It would be a significant improvement in the art to provide a method of forming LbL micro-patterns which avoided these shortcomings. Other references dealing with LbL self-assembly include: Decher, G., Science, 227, 1232 (1997); Lvov Y., Decher, G., Mohwald H., Langmuir, 9, 481 (1993); M. Onda, Y. Lvov, K. Ariga, T. Kunitake; "Multiple layered functional thin films" U.S. Pat. No. 6,020,175, both of which are incorporated by reference herein.

SUMMARY OF INVENTION

The present invention comprises a method of patterning self-assembled thin films. This method includes forming a photoresist layer on a substrate and then patterning and etching the photoresist layer. In combination with the etched photoresist layer, a self-assembled layer is formed on the substrate using LbL self-assembly.

The present invention further includes micro-structure of self-assembled thin films formed by a process comprising the steps of forming a photoresist layer on a substrate, patterning and etching the photoresist layer; and then forming a self-assembled polyion layer on the substrate by alternatively exposing the substrate to oppositely charged electrolyte solutions.

BRIEF DESCRIPTION OF THE DRAWINGS

FIG. 1 illustrates the steps taken in carrying out one embodiment of the method of the present invention.

FIG. 2 illustrates the steps taken in carrying out a second embodiment of the method of the present invention.

FIG. 3 illustrates the steps taken in carrying out a third embodiment of the method of the present invention.

FIG. 4 illustrates the steps taken in carrying out a fourth embodiment of the method of the present invention.

DETAILED DESCRIPTION OF INVENTION

Self-assembly of ultra-thin films through the alternate adsorption of oppositely charged components (e.g., linear polyions, nanoparticles and enzymes) allows the formation of layers of these components on a surface with a precision of a few nanometers in the direction perpendicular to the surface. The typical procedure of layer-by-layer self-assembly may be illustrated with the following example. A pre-treated silicon substrate is immersed in a poly-cationic solution for 10 minutes, forming a single layer of cationic polyelectrolytes on the substrate. The substrate is then rinsed. Next, it is immersed in polyanion solution for 10 minutes to adsorb a layer of anionic polyelectrolytes. This formation of one layer of cationic polyions and one layer of anionic polyions may be referred to as a "bilayer." This process can be repeated indefinitely; the only condition being a proper alternation of positive and negative components. Linear polyions frequently used in the layer-by-layer (LbL) assembly are cationic poly(ethylenimine) (PEI), poly (dimethyldiallyl ammonium chloride) (PDDA), poly(allylamine hydrochloride) (PAH), polylysine, chitosan, anionic sodium poly(styrenesulfonate) (PSS) and poly(vinylsulfate), polyacrylic acid, and DNA. Enzymes and charged nanoparticles have also been used in the LbL assembly. However, to use LbL-multilayers in devices, the patterning of the self-assembly film must be controlled not only in a vertical direction but also in the planar direction. This is of course critical for any nanodevice production, such as nanoelectronic chips or NEMS (Nano Electro Mechanical Systems).

In its more general embodiment, the method of the present invention includes forming a photoresist layer on a substrate and then patterning and etching the photoresist layer. The etching of the photoresist can be performed by any conventional method such as wet etching with solvents or ion beam etching or reactive ion etching (RIE). In combination with this photoresist patterning and etching, a self-assembled layer is formed on the substrate by alternatively exposing the substrate to oppositely charged electrolyte solutions. In one particular embodiment of the invention, the photoresist patterning and etching takes place prior to the application of the self-assembled layer. However, in other embodiments, a self-assembled layer is applied prior to the application, patterning, and etching of the photoresist layer. Still other embodiments will involve the inclusion of a metal layer above and/or below a photoresist and/or LbL self-assembly layer. Therefore, although the present invention includes the combination of at least one lithography step (e.g., photoresist patterning and etching) and one LbL self-assembly step, the invention is not limited in the sequence in which the steps occur. Additionally, where the following descriptions and claims recite forming a certain layer "on" a substrate, this is not limited to forming the layer directly on the substrate, but also includes forming the layer on one or more layers previously formed on the substrate.

FIGS. 1A–1H illustrate the sequence of steps carried out in one method of the present invention. In the methods shown in the Figures, the substrate 1 is shown as a conventional silicon wafer 2. However, other substrates could be employed in the present invention. For example, glass, polymers such as polymethylmethacrylate (PMMA), other hard polymers or practically any other hard surface could be employed. It is only necessary that the substrate be capable of having a sufficiently strong positive or negative charge to initiate the LbL self-assembly process. In the method of FIG. 1, a negative charge is induced on the wafer 2 by immersing it in a $H_2SO_4$ and $H_2O_2$ solution (at a ratio of 7:3 by volume) at 50° C. for one hour. However, those skilled in the art may readily note other chemicals which could be used for inducing a charge on the substrate as could other alternatives such as applying an electric field to the substrate. In the embodiment of FIG. 1, the wafer 2 is then "hardbaked" at 115° C. for one minute. As suggested in FIG. 1B, a photoresist layer 4 is formed directly (i.e. with no intervening layers) on wafer 2. Photoresist layer 4 may comprise any conventional photoresist such as Az1813 photoresist supplied by Shipley Company, LLC of Sunnyvale, Calif. The thickness may vary, but typically a minimum thickness of 0.5 to 1 micron is desirable while a thickness of over 3 or 4 μm begins to make the photoresist difficult to remove. The desired minimum thickness of the photoresist is typically influenced by the thickness of the self-assembly layer formed on the photoresist layer. It is desirable to have the photoresist layers at least as thick as the self-assembled layer in order to avoid any tendency of the self-assembly polyions to adhere to the substrate through the photoresist layer. In the present invention, a 1 μm photoresist layer is a suitable thickness. The photoresist layer may be applied to wafer 2 by any number of conventional methods. One acceptable application method is a conventional spin process with a spinning speed of 2000 rpm, ramped up at 200 r/s and maintained for 40 seconds. The photoresist application process is typically completed by hard baking the photoresist, for example, at 115° C. for one minute.

Figure 1A:
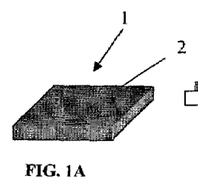
Figure 1B:
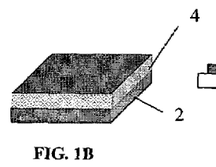
Figure 1C:
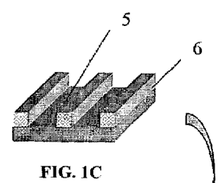
Figure 1D:
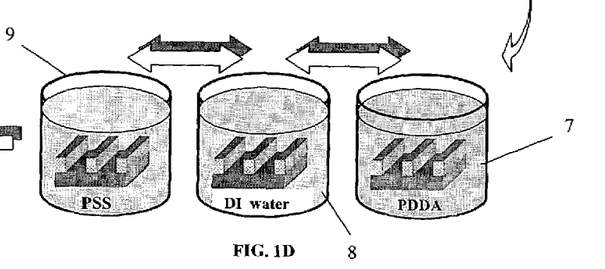
Figure 1E:
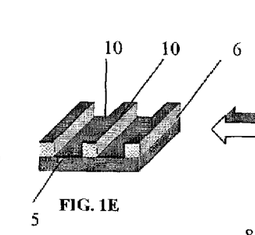

The photoresist layer 4 may be patterned by any conventional lithography technique. In one embodiment, UV light is projected through a photomask having the desired pattern for a sufficient time to cure or polymerize the photoresist in that pattern. For the 1 μm layer of Az 1813, 6 seconds is a sufficient exposure period. Substrate 2 is then placed in a suitable developer solution for sufficient time to develop the areas of polymerized photoresist. For example, immersion in MF-319 developer for 40 seconds is sufficient for the described photoresist layer 4. This technique results in the photoresist pattern suggested in FIG. 1C. Of course, this technique involves positive resist processing. Generally, negative resist processing could also be used, but positive resist processing typically provides better results when dealing with relatively smaller feature sizes. Naturally, the channels 5 formed in photoresist layer 4 and the remaining resist portions 6 seen in FIG. 1C are only a figurative representation of a photoresist pattern. The shape and definition of the pattern is limited only by the lithography method employed. For example, convention UV lithography will normally produce a feature size down to approximately 150 nm, while electron beam lithography may produce feature sizes as small as 10–15 nm.

After photoresist layer 4 has been patterned, a first self-assembly film is placed upon wafer 2. In the embodiment shown in FIG. 1D, this film is formed from PDDA/PSS bilayers. The PDDA polyions are provided in a 0.5 M NaCl aqueous solution, having PDDA particles with a molecular weight (MW) of 200 k to 300 k and in a concentration of 3 mg/ml. The PSS polyions are likewise provided in a 0.5 M NaCl aqueous solution, having PSS particles with a molecular weight (MW) of 70 k and in a concentration of 3 mg/ml. Wafer 2 is dipped into the PDDA solution 7, PSS solution 9 alternatively, in the sequence of PDDA for 10 minutes, rinsing in DI water 8 for 1 minute and drying by spinning the wafer at a speed of 1300 rpm for 40 seconds, and then dipping in PSS for 10 minutes. This process may be repeated any number of times with rinsing and drying between all steps. If the two bi-layers of PDDA/PSS film are formed on the substrate, the process for forming the two bi-layers can be described with the short-hand notation "[PDDA(10 min)+PSS(10 min)]$_2$", which notation will be used frequently herein. In the FIG. 1E embodiment, these two PDDA/PSS bi-layers serve as a precursor film layer 10 which provides the wafer surface with a stronger and more uniform charge.

Figures 1F, 1I:
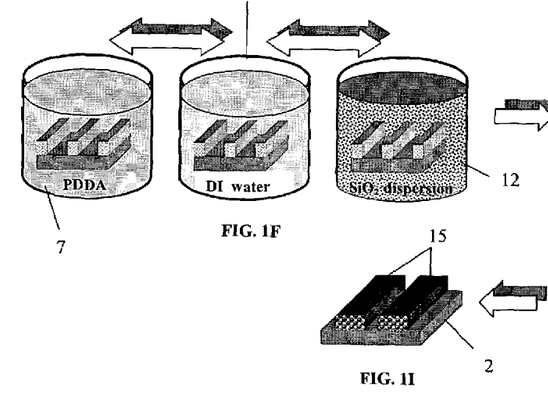
Figure 1G:
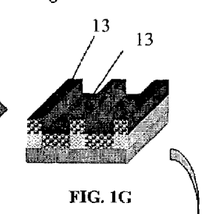
Figure 1H:
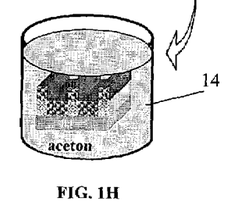

Thereafter, a second self-assembly film is formed from bilayers of PDDA and silica particle polyions as suggested in FIG. 1F. The silica polyions are 300-nm in diameter silica nanoparticles suspended in a 0.02 M NaCl aqueous solution at a concentration of 1 mg/ml and a pH of 9. This PDDA/silica film is constructed in the sequence of [PDDA(10 min)+silica(2.5 min)]. The number of bi-layers could be repeated infinitely until the desired height of the film of nanoparticles in the vertical direction is obtained. While the substrate is rinsed in DI water between PDDA/silica polyion coatings, the drying step carried out with the PDDA/PSS layer may or may not be omitted. Drying of the PDDA/silica layers was generally found to make removal of the PDDA/silica layers formed above the photoresist somewhat more difficult. However, drying does not significantly impede the removal of the PDDA/silica layers if ultrasonification (as discussed below) is employed. In the FIG. 1G embodiment, a single bi-layer renders a second self-assembly film 13 approximately 1 micron thick. To form the final film in the desired pattern, wafer 2 is placed into acetone solution 14 (99.9% concentration) as seen in FIG. 1H with ultrasonic treatment for 3 seconds to remove the remaining photoresist and lift-off the portion of the PDDA/silica film 13 formed on the remaining photoresist. This results in wafer 2 having a final PDDA/silica film formed thereon in the desired pattern 15 as suggested in FIG. 1I. This method may be referred to as a "lift-off" method, and Example 1 described further below uses a similar procedure (with some variations which are detailed in the example). Since the PDDA/silica film layer 13 forms part of the final micro-structure sought by the method, the PDDA/silica layer may be referred to as a "structural" layer as distinguished from the "precursor" layer 10.

The omitting of drying after rinsing the PDDA/silica layer or the ultrasonic treatment (if drying is employed) when removing the photoresist are two important steps to the process. Failure to utilize at least one of these two steps will result in an unpatterned area where polyion chains are not completely separated. The drying step in conventional alternate adsorption will help to form stronger connections among polymer molecules. However, the polymer molecule chains are easy to separate if drying is omitted in the last several cycles. The internal pressure resulting from the dissolving photoresist is typically not sufficient to remove the polyion layers surrounding photoresist. It is typically the ultrasonic wave that breaks the link among polyion chains.

FIG. 2 represents a second method of the present invention for patterning thin films utilizing the LbL self-assembly process. Similar to the method of FIG. 1, the 4-inch silicon wafer 2 in FIG. 2A is immersed in $H_2SO_4$ and $H_2O_2$ (at a ratio of 7:3 by volume) at 50° C. for one hour and hard baked at 115° C. on a hotplate for 2~3 minutes. However, rather than next forming the photoresist on wafer 2, a PDDA/PSS precursor film 10 is formed on wafer 2 with the sequence of [PDDA (10 min)+PSS (10 min)]$_2$ (FIGS. 2B and 2C). The PDDA polyion solution 7 and PSS polyion solution 9 along with the conditions of their application are the same as above. Next, a bi-layer of PDDA and blue-dyed carboxylate modified polystyrene particles 300 nm in diameter (also referred to herein as "Latex nanoparticles") are formed on wafer 2 as suggested by FIG. 2D. The polyion solution containing the Latex nanoparticles is formed by dispersing 5 mg/ml of Latex nanoparticles in DI water. The Latex nanoparticles are adsorbed alternately with PDDA in the sequence of [PDDA(10 min)+Latex(10 min)]. Again, this step may be repeated any number of times to obtain the desired thickness of PDDA/Latex film layer 21 (FIG. 2E).

Figure 2A:
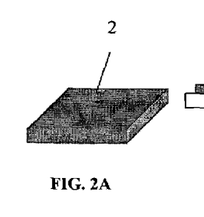
Figure 2B:
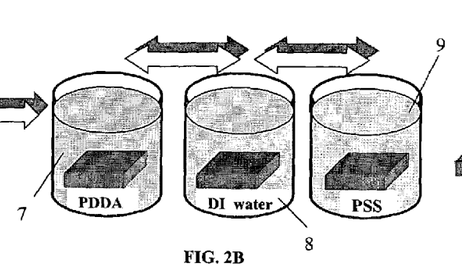
Figure 2C:
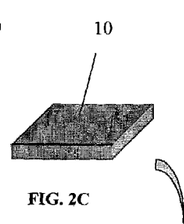
Figures 2D, 2E, 2H, 2I:
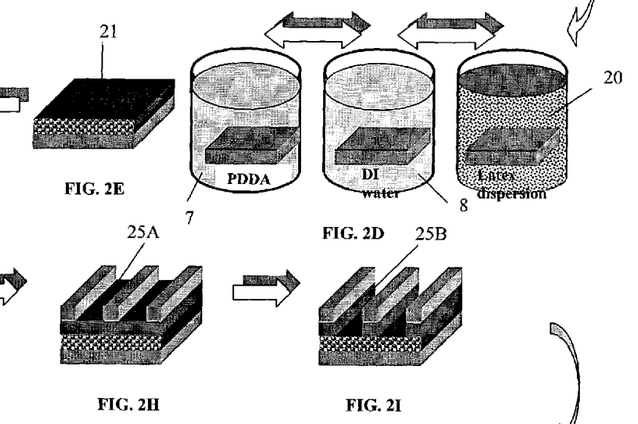
Figure 2F:
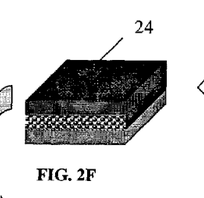
Figure 2G:
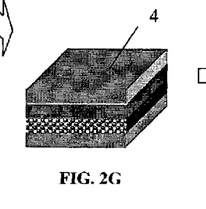
Figure 2J:
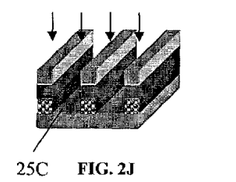
Figure 2K:
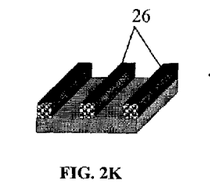

After application of the PDDA/Latex bi-layer(s), the substrate is heated at 100° C. for 10 minutes to drive off residual moisture in preparation for the next process step. Then, a metal layer 24 of aluminum 2500 Å thick is deposited on the Latex thin film 21. The deposition is carried out with a high vacuum evaporator at a pressure of 10–5 mtorr and a deposition rate of 2 Å per second. The thickness of the metal layer 24 may vary, but it is desired that it be thick enough to cover the particles in the previous layer. In this embodiment, 2500 Å thick is sufficient to cover the 300 nm particles. Of course, metals other than aluminum could be employed such as platinum or chromium, but aluminum is less expensive and typically easier to work with. Next, a 1 µm layer 4 of photoresist is spun onto wafer 2 (FIG. 2G) in the same manner as described above. It can be seen how PDDA/Latex layer 21 and metal layer 24 form intermediate layers between substrate 2 and photoresist layer 4. The same UV exposure and developing procedure is used to transfer the desired pattern onto the photoresist layer 4 as seen in FIG. 2H. Then the areas of the aluminum layer not covered by photoresist (channels 25A) are removed by an aluminum etchant such as phosphoric acid and nitric acid (136 g H3PO4+5.5 g H3NO3 per 100 ml) by immersion in the etchant at 70° C. for 2 minutes. Of course, other conventional aluminum etchants could be employed. To remove the areas of Latex not covered by aluminum (channels 25B in FIG. 2I), wafer 2 is exposed to a conventional reactive ion etching (RIE) system. One suitable set of RIE conditions are an oxygen flowrate of 8 seem, a pressure of 110 mTorr, and an electric power of 250 W. The etching time should be 5 min or less and will result in channels 25c seen in FIG. 2J. Thereafter, the remaining photoresist is removed by acetone as described above and the aluminum removed with the phosphoric/nitric acid solution described above. This forms the final latex pattern 26 seen in FIG. 2K. As an alternative to etching the aluminum, it can also be left on the Latex structures 26 to serve as electrodes if required by the ultimate pattern design.

FIG. 3 illustrates a still further embodiment of the present invention wherein a second material constitutes part of the final pattern formed onto the substrate. This method begins similar to that shown in FIG. 2 and except where explicitly noted, is identical in the steps taken up to and including the step illustrated in FIG. 2J. The wafer 2 seen in FIG. 3A includes the Latex bi-layer 21, the aluminum layer 24, and the photoresist layer 4 formed in the desired pattern. The Latex bi-layer is formed with polystyrene particles which are 150 nm in diameter as opposed to the 300 nm particles. As a result, aluminum layer 24 is applied with a thickness of 1200 Å as opposed to the 2500 Å thickness discussed above.

Figure 3A:
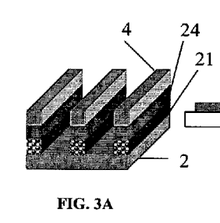
Figure 3B:
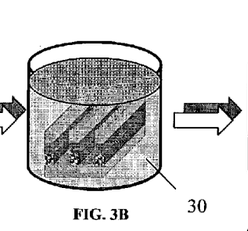
Figure 3C:
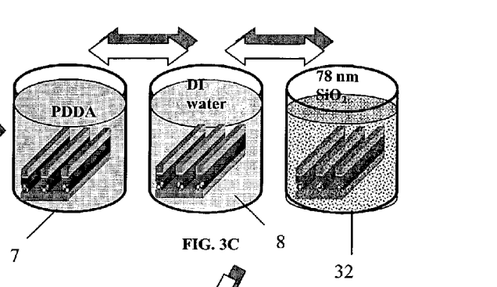
Figure 3D:
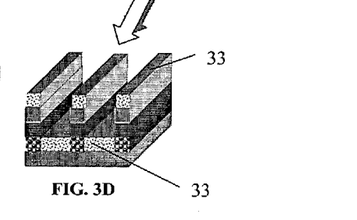
Figure 3E:
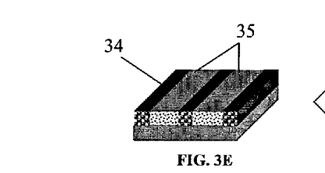

After removing the areas of Latex not covered by aluminum with reactive ion etching as described above, wafer 2 is placed in a rinse container 30 of DI water and agitated with ultrasonic wave energy. This serves to remove any scraps of materials loosely adhering to wafer 2 after the reactive ion etching step and typically, one minute of ultrasonic treatment is sufficient. Thereafter, Latex particles having a diameter of 78 nanometers dispersed in a 0.02 M NaCl aqueous solution 32 at a concentration of 8 mg/ml and pH of 9 are applied in the sequence [PDDA (10 min)+PSS (10 min)]$_2$+[PDDA (10 min)+Latex (2.5 min)]$_2$. This forms a Latex film 33 on top of the photoresist and in the channels between the remaining layers of aluminum and photoresist as suggested in FIG. 3D. Finally, wafer 2 is placed into an MF-319 solution for approximately ten minutes (and under ultrasonic vibration for several seconds) in order to remove the remaining photo resist and aluminum. The resulting two film structure is seen in FIG. 3E showing 150 nm Latex film structures 34 (the first structural layer) and 78 nm Latex film structures 35 (the second structural layer). This embodiment may be referred to as a plasma etching method.

The drying step is critical for LbL self-assembled films. It can improve the adhesion and thickness of the films by enhancing the linkage between the materials that compose the film and removing the moisture. In the laboratory, the drying was accomplished by hand using a nitrogen gun. The random fashion of this operation often makes the films nonuniform over the broad area of wafer surface. A more efficient way was found to use a spinner to spin off the water on the wafer surface. The rotational movement resulted in a much more uniform film which made the subsequent steps in the process easier. The rotating speed was set at 1300 rpm (a higher speed was not considered beneficial because it might drive the water drops away from the center too quickly such that the assembled materials could be carried away with them). Apparent radius traces created by liquid and solid flows were observed on the wafer surface at rotating speed above 1300 rpm.

When the lift-off was executed, acetone was not used to dissolve the photoresist, mainly because acetone was sometimes found to be detrimental to organic LbL assembled thin films, although the damage was not severe. In fact, the remaining resist was exposed again and later removed by M319 developer solution. The developer was also able to etch aluminum at a lower but controllable rate. Therefore, the developer also can work as the aluminum etchant after the photoresist is dissolved.

After the RIE dry etching of a nanoparticle thin film, tiny scraps were observed sticking to the channel, which was supposed to be a smooth and clean silicon surface. These scraps must be removed prior to the subsequent LbL self-assembly of silica nanoparticles and lift-off. Otherwise, the scraps may be dissolved from the surface during the lift-off and leave defects on the nanoparticle films. The scraps can be removed by vibrating the wafer in ultrasonic cleaner for approximately 1 min.

During the lift-off, it is better to introduce ultrasonic treatment for 3 seconds when the wafer is being soaked in developer solution. Within the nanoparticle film structure, polyion multilayers such as PDDA and PSS are sandwiched between the nanoparticle film and the photoresist layer as a kind of "chemical glue". The structure of the polyion is like a long thread which strongly links to each other. It is difficult to break them up during the lift-off, so that at some areas the nanoparticle and polyion multilayer can not be removed when the photoresist is dissolved. On the contrary, the polyions tend to return to the wafer surface and re-attach to the film underneath. The ultrasonic treatment was introduced to disconnect the linkage between polyion branches and obtain a more distinct pattern with higher reproducibility.

FIG. 4 illustrates a forth method of the present invention. In this method, two film layers are patterned onto the substrate. In the embodiment shown, each film comprises carboxylate modified polystyrene particles but of different diameters, 150 nm and 64 nm. The dispersion for both particle diameters was created by placing 5 mg/ml of the particles in a 0.2 M, pH 9 NaCl solution.

Wafer 2 was treated with an $H_2SO_4$ and $H_2O_2$ and hard baked as described above. A photoresist layer was formed on wafer 2 and a pattern 6 was transferred to the photoresist layer, also in the same manner as described above. Next, the 150 nm polystyrene particles were coated onto wafer 2 by the sequence of [PDDA(10 min)+PSS (10 min)]$_2$+[PDDA (10 min)+Latex (10 min)]$_2$ to form film layer 40 as suggested by FIG. 4B. The PDDA/PSS bilayers again function as a precursor, but for the sake of brevity are not described as a separate precursor layer. Next, a 900 Å thick aluminum layer 41a is formed over the Latex particle layer 40 using the aluminum evaporation process and conditions described above and seen in FIG. 4C.

Then a second layer 43 of 150 nm polystyrene particles are formed in the sequence of [PDDA (10 min)+PSS (10 min)]+[PDDA (10 min)+Latex(10 min)]$_2$. Thereafter, a second 800 Å thick aluminum layer 41b is formed over latex layer 43 as suggested by FIG. 4D.

Figure 4A:
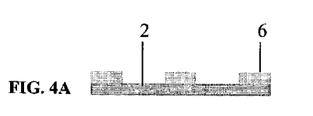
Figure 4B:
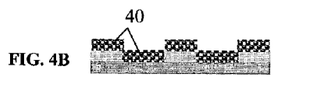
Figure 4C:
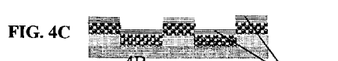
Figure 4D:
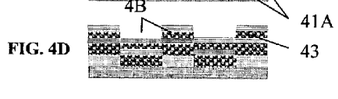
Figures 4E, 4F:
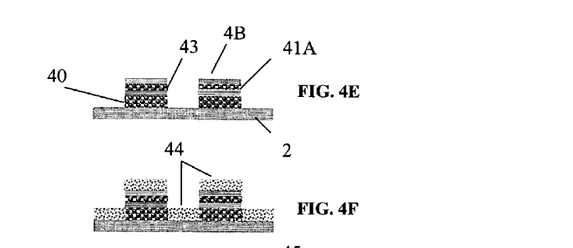

Next, wafer 2 is placed in acetone under the conditions described above (with ultrasonic treatment) and the remaining photoresist along with the aluminum layers 41a and 41b and Latex layers 40 and 43 above the photoresist pattern 6 are removed, resulting in the pattern seen in FIG. 4E. Then the 64 nm polystyrene particles are assembled on wafer 2 by the sequence of [PDDA (10 min)+PSS (10 min)]2+[PDDA (10 min)+Latex(10 min)] as in FIG. 4F. Next, the remaining sections of the aluminum layers 41a and 41b are dissolved in a MF-319 solution (at a volume ratio of 1:6 MF-319: water), leaving the patterned film of 150 nanometer particles 42 and the patterned film of 64 nanometer particles 45 as seen in FIG. 4G. This method may be referred to as the two lift-off method (lift-off of photoresist and then lift-off of aluminum) and is applicable to all kinds of nanomaterial thin films.

The thickness of the aluminum layers is an important factor to be taken into consideration in the process. It has been found that a thick aluminum layer may peel off many parts of the 150 nm nanoparticle films under it. On the other hand, a too thin aluminum layer is not enough to lift off all 64 nm nanoparticles on top of the thin layer. One solution disclosed above is to split the aluminum into two layers and insert two or three layers of 150 nm nanoparticle films in between. As described, the first layer of aluminum deposited is 900 Å which is right above the 150 nm nanoparticle film. The second aluminum layer which is 800 Å in thickness is separated from the first layer by two or three layers of weakly attached 150 nm nanoparticle films. This layer of 150 nm particles is comparatively weakly attached because no precursor layers are applied to the 900 Å aluminum layer. When the aluminum is being dissolved, the 900 Å aluminum can not peel off the first layer of 150 nm nanoparticle films and a total thickness of 1700 Å of aluminum can lift off the 64 nm nanoparticles completely.

EXPERIMENTAL EXAMPLES

Example 1

Patterning Silica Nanoparticles Through Wet Etching

The materials used in the experiment were the following: poly(ethyleneimine) (PEI) aqueous solution, 1 mg/mL, MW 25K; sodium poly(styrenesulfonate) (PSS) 3 mg/mL, MW 70K, in a 0.5 M NaCl solution; poly(dimethyldiallyl ammonium chloride) (PDDA) 3 mg/mL, in a 0.5 M NaCl solution, pH 7 (all available from Sigma-Aldrich of Milwaukee, Wis.); and dispersion of 300-nm diameter silica nanoparticles in a 0.02 M NaCl solution, 1 mg/mL, pH 9 (Bang, Inc. of Fishers, Ind.), or 45-nm diameter fluoresbrite microspheres 2.5 mg/mL, in a 0.02 M NaCl solution (Polyscience, Inc. of Warrington, Pa.). Silicon wafers (Silicon, Inc. of Boise, Id.) were used. The spin-coating machine (Brewer Science, of Rolla, Mo.), a UV-lamp, and Az1813 photoresist were used for the lithography process. For analysis of the pattern structures, a Scanning Electron Microscope (SEM) (AMRAY of Bedford, Mass.), Olympus Epifluorescense Microscope, and Wyko RST white light interferometric microscope were employed.

A 4 inch silicon wafer was hydrophylizied by treatment with $H_2SO_4$ and $H_2O_2$ solution (volumes ratio 7:3) at 50° C. for 1 hour. Then, the wafer was "hardbaked" at 115° C. on a hotplate for 2~3 minutes to remove the moisture in preparation for the subsequent lithography steps. A photoresist layer of 1 µm was spun onto the wafer. It was exposed under the UV-lamp for 1.5 minutes through a photomask having the desired pattern and the pattern was transferred to the surface of photoresist by developing. The image consisted of 5 µm-wide strips and spaces. Then the wafer was dipped into PEI, PSS, and PDDA solutions alternatively, in the sequence of PEI(20 minutes)+[PSS(10 minutes)/PDDA (10 minutes)]$_3$. This left the outermost layer positively charged. Then the 300 nm silica nanoparticles were adsorbed in the sequence of [PDDA(10 minutes)/silica(2 minutes)]$_{10}$. For the first three steps, the substrate was rinsed with DI-water for 1 minute and dried by nitrogen flow between immersions. After that, the intermediate rinsing was still necessary, but the drying was skipped. Finally, the substrate was put into an acetone solution with ultrasonic treatment for 20 seconds to remove the remaining photoresist.

On the resulting wafer, there could be seen clear and distinct SEM images. The 5-µm strips containing the polyion precursor with nanoparticle multilayers were well shaped and had sharp borders. Silica nanoparticles were closely packed with few vacancy-defects. The average roughness of the strip borders was less than one particle diameter (in this case 300 nm, but could be less if smaller particles are used). There were no particles in the areas between the strips. The cross section of the image revealed an exceptionally well formed image: strips were evenly separated and shaped and had the same height of 3000 nm. The height of the strip may be precisely controlled with LbL assembly. The present experiment included ten steps of silica/PDDA deposition and each step gave 300-nm thickness increase, which corresponds to triple silica layer. One layer thickness can be adjusted by lowering the ion strength of the silica dispersion.

This is because with sufficiently low ionic strength the particles of the second layer are able to "sink into" the preceding layer. See Lvov, Y.; Ariga, K.; Ichinose, I.; Kunitake, T. *Langmuir* 1997, 13, 6195; Takeshi S, Satoko K. *Colloids and Surfaces.* 2000, 164, 237; which are incorporated by reference herein in their entirety.

These results indicate that polyion layers are permeable enough to let acetone molecules penetrate inside to dissolve photoresist and strip off the multilayers from the regions above the photoresist. The strip border sharpness indicates that the intercalation length between neighboring molecules in a polyion layer is less than 200 nm. In a control sample, which had not been sonicated during the step of removing the photoresist with acetone, the silicon wafer remained entirely covered by $SiO_2$ particles. The polyion layers as well as particles above them were not lifted off and collapsed back during drying, which prevents the pattern formation. The collapse of the polyion layers and particles was due to the links not being broken at the edge of the photoresist sidewall by the etching process. Drying at each LbL self-assembly step also resulted in poor final patterns. The presence of particle clusters, instead of the pattern, was noted and was due to incomplete removal of the polyion film located above the photoresist.

In another experiment, fluorescent negatively charged 45-nm diameter fluorescent nanoparticles were assembled above a similar precursor in the sequence of: [PEI+(PSS/PDDA)$_3$+(Fluoresbright/PDDA)$_3$] following the same experimental procedure. Another mask with wider strips was used to provide a pattern well visible in an optical microscope. The image through the microscope showed a sharp green pattern indicating permanent coverage with the width of the strips being 25 μm, and 12 μm wide dark areas without fluorescent multilayer.

In regards to the surface roughness of the created pattern, the root mean square roughness and average roughness are defined by equations:

$$R_q = \frac{1}{L}\left[\int_0^L Z^2(x)\,dx\right]^{1/2} \text{ and } R_a = \frac{1}{L}\int_0^L |Z(x)|\,dx; \quad (1)$$

where Z(x) is the difference of surface coordinate and the mean value. If the spherical particles are uniformly coated and closely packed, then the roughness should be approximately one fourth of the diameter, i.e., 75 nm. Our experimental result (87 nm) substantially agrees with this and implies a closely packed layered structure. The surface roughness can be reduced by using smaller particles in the LbL assembly. It is interesting to compare the present invention's approach on 2D-micropatterning of polyion/nanoparticle multilayers with thiol compound microprinting of charged patterns on gold support and further LbL assembly of multilayers disclosed in publications such as: Chen, K.; Jiangi, X.; Kimerling, L.; Hammond, P. *Langmuir* 2000, 16, 7825; Jiang, X.; Hammond, P. *Langmuir* 2000, 16, 8501; Jiang, X.; Zheng, H.; Gourdin, S.; Hammond, P. *Langmuir* 2002, 18, 2607; and Zheng, H.; Lee, I.; Rubner, M.; Hammond, P. *Adv. Mat.* 2002, 14, 681; all of which are incorporated by reference herein. Both methods give patterns of approximately the same quality with minimal elements of about 1–2 μm, edge roughness about 0.1–0.2 μm, and clear support surface between the pattern features. One of the advantages of the present invention's lithographic approach is that it is compatible with existing silicon micromanufacturing technology. This means that for industrial application one can use existing silicon wafer technology to produce 4 inch diameter silicon wafer completely covered with needed patterns of nanoparticle multilayers. With the microprinting approach, it is difficult to produce a perfect pattern on surface area more than a few mm$^2$. On the other hand, in the microprinting approach one can assemble biological (protein, DNA) multilayers on charged patterns. It is more difficult in the lithographic approach because of need to dissolve in organic solvent photoresist underlayer at the final stage of the process. In a recent development, polyion stamping on supports other than golds and possibility to fill gaps between polyion/nanoparticle strips with the second component through hydrogen bonding was elaborated. In the lithographic approach it is also possible to fill gaps between LbL assembled strips with a second component using metal mask etching and oxygen plasma treatment similar to the approach used in VLSI (Very Large Scale Integrated Circuits) industry.

Example 2.1

Patterning Polystyrene Nanoparticle-Based Thin Film With Plasma Dry Etching

Materials and equipment: The polyelectrolytes employed were poly(dimethyldiallyl ammonium chloride) (PDDA) aqueous solution, MW 200 to 300K, 3 mg/mL, 0.5 M NaCl and sodium poly(styrenesulfonate) (PSS) aqueous solution, MW 70K, 3 mg/mL, 0.5 M NaCl. These were obtained from Aldrich-Sigma of Milwaukee, Wis. The dispersion of blue-dyed carboxylate modified polystyrene particles 300 nm in diameter was obtained from Seradyn Inc. of Pamsey, Minn. The photoresist was Shipley AZ1813. Electronic-Vision dual side mask aligner EV420 from Electronic Visions, Inc. of Rockledge, Fla. was used as the UV light illuminator. The aluminum layers were deposited by a DV-502A high-vacuum evaporator from Denton Vacuum, Inc. of Moorestown, N.J. A Wyko RST white light interferometer microscope was the instrument employed for surface measurement. An 800 series micro RIE system from Technics Inc. of Dublin, Calif. was the etching facility to remove organic (e.g. Latex) nanoparticles.

To initiate the experiment, the 4 inch silicon wafer was first put into sulfuric acid and hydrogen peroxide solution (volume ratio 3:7) at 70° C. for 1 hour. It then was immersed in 50 ml PDDA solution for 20 minutes. After that, it was rinsed in DI water for 1 minute and dried by nitrogen flow. It was then immersed in 50 ml PSS solution for 10 minutes, rinsed and dried as in the previous step. The cycle was repeated in a sequence of {PDDA (20 minutes)+[PSS (10 minutes)+PDDA (10 minutes)]$_2$}. The intermediate rinsing and drying were necessary. After this process, the outermost layer was positively charged PDDA. Then, the wafer was immersed in 50 ml diluted polystyrene aqueous solution for 10 minutes (aqueous solution was made in a dispersion to water volume ratio of 1:9), rinsed and dried, followed by another cycle of {PDDA (10 minutes)+polystyrene (10 minutes)}. Therefore the complete sequence of adsorption is {PDDA (20 minutes)+[PSS (10 minutes)+PDDA (10 minutes)]$_2$}+{polystyrene (10 minutes)+PDDA (10 minutes)+polystyrene (10 minutes)}. The wafer should be heated at 100° C. for 10 minutes to remove the moisture in the films in preparation for deposition of an aluminum layer by thermal evaporation. The deposition of aluminum was carried out at a pressure of 10$^{-5}$ mtorr with a deposition rate of 2 Å per second until a thickness of 2500 Å was reached.

After it was taken out of the vacuum chamber, a photoresist (AZ 1813) layer one micron thick was spun onto the aluminum layer at a maximum speed of 2000 rpm for 40 seconds. The photoresist was baked at 115° C. on a hotplate for 1 minute. Then the silicon wafer was put on the mask aligner, which is a UV light irradiation instrument with a chrome mask between the light source and the wafer. The time of exposure was set at 6 seconds. Later, it was developed by MF-319 developer for 30 seconds and rinsed by DI water. The aluminum etchant, phosphoric acid and nitric acid (136 g $H_3PO_4$+5.5 g $H_3NO_3$ per 100 ml) was used at 70° C. for 2 minutes to remove the aluminum not covered by the photoresist. The wafer was put in the vacuum chamber of the reactive ion etching system to etch the Latex not covered by aluminum. The etching conditions were oxygen flow rate of 8 sccm, pressure of 110 mTorr, and electric power of 250 W. The etching time was 5 minutes. Thereafter, the remaining photoresist was removed by acetone. The aluminum could be either removed by its etching solution or alternatively left as an electrode.

Two samples of polystyrene nanoparticles were prepared by this process. One was fixed on the stage of a SEM for observation. Prior to taking any pictures, TiPt alloy was sputtered on the sample surface for 40 seconds at a pressure of 0.1 Torr and a current of 12 mA. The scanning electron microscope was set up at 25 kV and maximum magnification of 20K. The other sample was measured by WYKO roughness stepper testing (RST) for its surface characteristics including average roughness($R_a$), rms roughness($R_q$), and surface topography. An area of 213.7 microns by 317 microns was selected as a block area to measure the roughness at VSL mode and a 3-D plot was produced on the U-like pattern.

Example No. 2.2

Patterning Silica Nanoparticle-Based Thin Film With Wet Etching

Materials and Equipment: The polyelectrolytes involved were the same as in experiment 2.1 unless specifically stated otherwise. Silica particles 300 nm in diameter were obtained from Polyscience, Inc. Buffered hydrogen fluoric acid (BHF) was made as a mixed solution of fluoric acid and ammonium fluoride with a volume ratio of 1:6. Chrome was deposited by a PVD-300 sputtering system from Uniform Technology of Orem, Vt. The chrome etching solution was a mixture of 83 g ceric ammonium nitrate, 2 ml perchloric acid and 50 ml DI water. The analytic instruments were the same as in the experiment 2.1.

The wafer was pre-treated and silica particles (rather than Latex particles) were coated on it as in experiment 2.1. Then a layer of chrome 2500 Å thick was sputtered on in the high vacuum chamber of PVD-300 sputtering system at a rate of 800 Å per minute. Photoresist was patterned in a similar way as in experiment 2.1 and the chrome was etched by the etching solution. Finally, the silica particles were removed by immersing in BHF solution for 20 seconds instead of by dry etching. The remaining photoresist and chrome were subsequently dissolved by acetone and etching solution.

The image on the mask was transferred onto the nanoparticle layer quite well by the metal mask approach. This generated a comb shaped pattern with the particle occupied area and the blank area separated clearly and sharply. SEM pictures illustrated a sharp border along the blank area and particle covered area could be seen. It was quite interesting that many of the spherical particles along the border were observed to be cut in half. This is due to the oxygen plasma with high kinetic energy etching the particles that are not covered by the metal mask. This factor will improve the sharpness of the pattern. In the picture with the highest magnification, tiny defects about one particle diameter in size along the border could be observed. This may result from the roughness of the particle surface. The aluminum patterning is not carried out on the smooth silicon surface as typical in conventional lithography, but is deposited on the rough surface of the polystyrene particles. This may effect the uniformity of aluminum deposition and photoresist coating. The straightness of the border that results from a series of the process of deposition, UV exposure, and development may not be quite as satisfactory as that on a very smooth substrate. This approach is applicable to both organic and inorganic particles such that this method is compatible with most of the important nanoparticles used in conventional MEMS construction.

Another main advantage of this method is its significant reliability. Because conventional lithography has already reached the nanometer scale, the patterning of nanoparticle thin film can be done at the same level. In these experiments, the smallest sized feature is 10 μm, but this can be continuously downscaled if the mask has the smaller feature size.

The principle of this approach is to use a metal layer as a mask when etching the nanoparticle layers underneath. The selection of metal is flexible. In our experiments, aluminum and chrome were chosen. Certainly, another optional mask material over the nanoparticles is photoresist and it may simplify the process greatly. The reason why it was not chosen here is that photoresist is not suitable to the ultimate target of 3 dimensional nano-scale architecture fabrication. The first layer of resist remaining as the mask would be irradiated by the UV light when the second layer of photoresist is exposed. The first layer would be dissolved with the second when undergoing the second developing step. As a result, the metal mask layer may be the best way to avoid these issues.

Pictures illustrated the 3-D plot and surface roughness of the created pattern. The rms roughness and average roughness are defined as above.

The roughness should approximate one-fourth of the diameter, i.e., 75 nm in theory when the particles are all uniformly coated and closely packed. The experimental result was in agreement with theoretical values and implies a quite closely packed structure. To some extent, the roughness might be reduced by using smaller particles. But on the other hand, smaller particles usually have a wider size distribution which may result in more serious irregularity. In the situation where a perfect surface is necessary, for example when a 3D platform is to be built, this is the factor that must be taken into consideration. Any defect like pinhole also needs to be avoided in order to prevent short-cut between top and bottom layers and to enhance the conductivity of the conductive layers. Higher concentrations of particle solution, for example 10 mg/ml, may likely lead to better results.

Example 3

Patterning of Two Types of Nanoparticles

Polyelectrolytes were obtained from Aldrich-Sigma and were used as follows: (1) poly(dimethyldiallyl ammonium chloride) (PDDA) aqueous solution, MW 200 to 300K, 3 mg/mL, 0.5 M NaCl, (2) sodium poly(styrenesulfonate) (PSS) aqueous solution, MW 70K, 3 mg/mL, 0.5 M NaCl.

Blue-dyed carboxylate modified polystyrene particles, 150 nm in diameter, were obtained from Seradyn Inc. The polystyrene aqueous solution was made in dispersion to water volume ratio of 1:9. The silica nanoparticles dispersion (8 mg/mL) was diluted from Snow-Tex colloidal silica (40.9% wt %, PH 9.6, 78 nm in diameter) which was made by Nissan Chemical Industries, Ltd. of Houston, Tex. The photoresist is Shipley AZ1813. Electronic-Vision dual side mask aligner EV420 from Electronic Visions, Inc. of Rockledge, Fla. was used as the UV light illuminator. Aluminum layers were deposited by DV-502A high-vacuum evaporator from Denton Vacuum, Inc. of Moorestown, N.J. Dry etching was carried out using an 800 series micro RIE system from Technics, Inc. of Dublin, Calif. Ultrasonication was performed using an 8892 Cole-Parmer of Vernon Hill, Ill. ultrasonic cleaner.

Initially, the 4 inch silicon wafer was put into sulfuric acid and hydrogen peroxide solution (volume ratio 3:7) at 70° C. for 1 hour. After which LbL assembly of 150 nm polystyrene particles was carried out on the silicon wafer. The sequence of the alternate immersion was: [PDDA (10 min)+PSS (10 min)]$_2$+PDDA (10 min)+polystyrene (10 min). The intermediate rinsing and drying after each immersion was necessary. The rinsing was done by purging the wafer in the DI water flow for 1 min. The wafer was placed on a spinner and spun to remove water by centrifugal force. The maximum rotating speed was set at 1300 rpm for a time of 45 seconds. The wafer was heated at 100° C. for 10 minutes to completely remove moisture in the films, after which aluminum was deposited by thermal evaporation. The deposition of aluminum was carried out at a pressure of $10^{-5}$ mtorr with a deposition rate of 2 Å/S until a thickness of 2500 Å was reached. After it was taken out of the vacuum chamber, a photoresist (AZ 1813) layer one micron thick was spun on the aluminum at the maximum speed of 2000 rpm for 40 seconds. The photoresist was baked at 115° C. on a hotplate for 1 min. Then the silicon wafer was placed on the mask aligner to be exposed under UV light irradiation in order to transfer the pattern on the chrome mask to the photoresist. The time of exposure was set at 6 seconds. Later, it was developed by MF-319 developer for 30 seconds and rinsed by DI water. The aluminum etchant, phosphoric acid and nitric acid (136 g $H_3PO_4$+5.5 g $H_3NO_3$ per 100 mL), was used at 70° C. for 2 min to remove aluminum. It was then put in the vacuum chamber of the reactive ion etching system to etch the polystyrene particle film. The etching conditions were the followings: an oxygen flow rate of 8 sccm, a pressure of 110 mTorr, and an electric power of 250 W. The etching time was 5 min. So far, the thin film of polystyrene nanoparticles which had been patterned remained covered by the aluminum and photoresist. Scraps sticking to the silicon surface remained which resulted from the oxygen bombardment upon the nanoparticle layer. The wafer was immersed in ultrasonic cleaner containing DI water for 1 min to clean all of these scraps. The wafer was placed under UV light for another 6 seconds to expose all the remaining photoresist. The photo resist was then removed followed by removal of the remaining aluminum using the same etchant described above.

Next, a layer of 78 nm silica nanoparticle thin film was adsorbed on the surface using LbL self-assembly. The sequence of immersion was: [PDDA (10 min)+PSS (10 min)]$_2$+PDDA (10 min)+silica (10 min). The intermediate rinsing and drying were still necessary and were carried out as described above. The wafer was soaked into developer solution MF-319 for 10 minutes to dissolve photoresist and aluminum and during the first minute, the ultrasonic bath was introduced for roughly 3 seconds to improve the lift-off. Eventually, the pattern was obtained with two types of particles located next to each other.

The wafer sample was fixed on the stage of the SEM for observation. Before the picture was taken, TiPt alloy was sputtered on the sample surface for 40 seconds at a pressure of 0.1 Torr and a current of 12 mA, since conventional SEM's can only observe conductive samples. This TiPt layer rendered the samples conductive. The scanning electron microscope was set up at 25 kV and maximum magnification of 30 K.

The SEM pictures showed that clear patterns of 5 μm feature size were created with a sharp border between 78 nm silica and 150 nm polystyrene nanoparticles. A picture at a magnification of 30 k showed that the two types of particles are thoroughly separated by this method. UV light lithography, wet etching, dry etching and lift-off are all ordinary microelectronic processes. An optimized combination of them can offer a strong capability to apply the conventional lithography to LbL self-assembly nanotechnology. The high reproducibility of the processes ensures that almost all the patterns on the 4 inch wafer will be of a similar high quality.

Example 4

Polyelectrolytes were obtained from Aldrich-Sigma and were used as follows: (1) poly(dimethyldiallyl ammonium chloride) (PDDA) aqueous solution, MW 200 to 300K, 3 mg/mL, 0.5 M NaCl, (2) sodium poly(styrenesulfonate) (PSS) aqueous solution, MW 70K, 3 mg/mL, 0.5 M NaCl. The colloidal carboxylate modified polystyrene particles, 150 nm and 64 nm in diameter, were obtained from Seradyn Inc. They were diluted to 8 mg/ml in DI water. The photoresist was NPR-1500 negative resist from Futurrex of Franklin, N.J. MF-319 solution from Shipley was diluted to 1:6 (volume ratio) to dissolve the aluminum. EV420 UV light illuminator was from Electronic Visions, Inc. Aluminum layers were deposited by DV-502A high-vacuum evaporator from Denton Vacuum, Inc. An 8892 Cole-Parmer ultrasonic cleaner was used during the lift-off.

Initially, the 4 inch silicon wafer was put in a sulfuric acid and hydrogen peroxide solution (volume ratio 3:7) at 70° C. for 1 hour. It was baked by a hotplate at 150° C. for 3 minutes. The negative photoresist was dropped onto the wafer and spun at the speed of 1000 rpm for 40 seconds and baked by the hotplate at 150° C. again for 80 seconds. Then it was placed under a mask and exposed by the UV light irradiation for 26 seconds. It was baked by the hotplate at 100° C. for 85 seconds and developed by its developer RD-6 for 12 seconds. At this point, the patterns on the mask had been transferred onto the photoresist.

The wafer was immersed in the PDDA, PSS and 150 m polystyrene nanoparticle solutions alternately in a sequence of: [PDDA (10 min)+PSS (10 min)]$_2$+[PDDA (10 min)+polystyrene (10 min)]$_3$. The intermediate rinsing (1 min in DI water) and drying steps should be included to ensure a strong and clean film. A layer of 900 Å thick aluminum was evaporated onto the nanoparticle thin film. After which 3 layers of 150 nm particles were coated once more in a sequence of [PDDA (10 min)+polystyrene (10 min)]$_3$. After that another layer of 800 Å thick aluminum was evaporated on. The wafer was put in the acetone solution to perform the lift-off step during which ultrasonication was introduced to help remove the polyion thin films positioned above the photoresist.

Then 64 nm polystyrene nanoparticles were coated on the entire surface in a sequence of [PDDA (10 min)+PSS (10 min)]$_2$+[PDDA (10 min)+polystyrene (10 min)]$_1$. Finally, the wafer was put into MF-319 solution (volume ratio 1:6) to dissolve the aluminum and remove the smaller particles above it. Ultrasonication was necessary during the lift-off to remove the polyion and smaller nanoparticles above and between the aluminum layers.

SEM pictures showed that the two types of nanoparticles, 64 nm and 150 nm polystyrene, were successfully settled in different regions as desired. The designed patterns consisted of regularly arranged squares with sides of 5 µm and a 5 µm distance between adjacent squares The 64 nm nanoparticles were filled into the tiny squares with 150 nm particles surrounding them.

As mentioned above, the ultrasonication should be introduced during the lift-off to break the linkages among the polyion layers. The negative photoresist and aluminum were selected as the lift-off materials in this experiment. The photoresist is a common lift-off material. Of course, other substitute materials can be selected instead of aluminum. MF-319 served as the aluminum solvent due to the slow dissolving rate that allows good control of the dissolving step.

While the present invention has been described in terms of specific embodiments and examples, there are many variations and modifications of these specific embodiment which will be obvious to persons of ordinary skill in the art. All such variations and modifications are intended to come within the scope of the following claims.

We claim:

1. A method of patterning self-assembled thin films comprising the steps of:
   a. forming a photoresist layer on a substrate, patterning and etching said photoresist layer;
   b. forming a self-assembled polyion layer on said substrate by alternatively exposing the substrate to oppositely charged electrolyte solutions;
   c. forming a metal layer on said self-assembled layer by a vacuum deposition technique; and
   d. subjecting said substrate to ultrasonification in order to lift-off a portion of said self-assembled polyion layer.

2. The method of patterning self-assembled thin films according to claim 1, wherein said photoresist layer is formed directly onto said substrate.

3. The method of patterning self-assembled thin films according to claim 1, wherein at least one intermediate layer is formed between said photoresist layer and said substrate.

4. The method of patterning self-assembled thin films according to claim 3, wherein said intermediate layer is a self-assembled polyion layer.

5. The method of patterning self-assembled thin films according to claim 3, wherein said intermediate layer is a metal masking layer.

6. The method of patterning self-assembled thin films according to claim 4, wherein a second intermediate layer is a metal masking layer.

7. The method of patterning self-assembled thin films according to claim 1, wherein a metal masking layer is deposited onto said substrate prior to forming said photoresist layer on said substrate.

8. The method of patterning self-assembled thin films according to claim 1, wherein said substrate is pretreated to form a net positive or negative charge on said substrate.

9. The method of patterning self-assembled thin films according to claim 1, wherein said method further comprises the steps of:
   a. pretreating said substrate by forming a net charge on said substrate prior to forming said photo-resist layer; and
   b. removing remaining photoresist in said photoresist layer, thereby removing a portion of said layers formed above said remaining photoresist.

10. The method of patterning self-assembled thin films according to claim 9, further including forming a precursor self-assembled layer of a second material on said substrate by alternatively exposing said substrate to oppositely charged electrolyte solutions.

11. The method of patterning self-assembled thin films according to claim 1, wherein said method further comprises the steps of:
   a. pretreating said substrate by forming a net positive or negative charge on the substrate prior to forming said photo-resist layer;
   b. forming a photoresist layer on said metal layer;
   c. forming a pattern on said photoresist layer;
   d. removing said photoresist within said pattern, said metal layer and said self-assembled layer beneath said pattern; and
   e. removing remaining photoresist and remaining metal, thereby leaving a patterned film of said first material.

12. The method of patterning self-assembled thin films according to claim 1, wherein said method further comprises the steps of:
   a. pretreating said substrate by forming a net negative charge on said substrate prior to forming said photo-resist layer;
   b. forming said self-assembled structural layer of a first material on said substrate by alternatively exposing said substrate to oppositely charged electrolyte solutions;
   c. forming a photoresist layer on the metal and forming a pattern on said photoresist layer;
   d. removing said photoresist within said pattern, said metal layer and said first material self-assembled layer beneath said pattern;
   e. forming a second self-assembled structural layer of a second material on said substrate by alternatively exposing said substrate to oppositely charged electrolyte solutions; and
   f. removing remaining photoresist and remaining metal, thereby leaving a patterned film of said first and second materials.

13. The method of patterning self-assembled thin films according to claim 12, further including forming a precursor self-assembled layer of a third material on said substrate by alternatively exposing said substrate to oppositely charged electrolyte solutions.

14. The method of patterning self-assembled thin films according to claim 1, wherein said method further comprises the steps of:
   a. pretreating said substrate by forming a net negative charge on said substrate prior to forming said photo-resist layer;
   b. forming said self-assembled layer of a first material on said substrate by alternatively exposing said substrate to oppositely charged electrolyte solutions;
   c. forming said metal layer as a first metal layer on said layer of first material;
   d. forming a second self-assembled layer on said substrate by alternatively exposing the substrate to oppositely charged electrolyte solutions;
   e. forming a second metal layer on said second self-assembled layer;

f. removing remaining photoresist in said photoresist layer, thereby removing a portion of said layers formed above said remaining photoresist;

g. forming a third self-assembled layer of a second material on said substrate by alternatively exposing the substrate to oppositely charged electrolyte solutions; and h. removing remaining metal in said metal layers, thereby removing a portion of said layers formed above said remaining metal and forming a patterned film of said first and second materials.

15. A method of patterning self-assembled thin films comprising the steps of:

a. forming a photoresist layer on a substrate, patterning and etching said photoresist layer;

b. forming a first self-assembled polyion layer on said substrate by alternatively exposing the substrate to oppositely charged electrolyte solutions with a drying step between exposure to said oppositely charged solutions;

c. forming a second self-assembled polyion layer on said substrate by alternatively exposing the substrate to oppositely charged electrolyte solutions in the absence of a drying step between exposure to said oppositely charged solutions; and d. subjecting the substrate to ultrasonification in order to lift-off a portion of said self-assembled polyion layer.

* * * * *